US010459258B2

(12) United States Patent
Baik et al.

(10) Patent No.: US 10,459,258 B2
(45) Date of Patent: Oct. 29, 2019

(54) META OPTICAL DEVICE AND METHOD OF DESIGNING THE SAME

(71) Applicant: SAMSUNG ELECTRONICS CO., LTD., Suwon-si (KR)

(72) Inventors: Chanwook Baik, Yongin-si (KR); Changwon Lee, Hwaseong-si (KR); Heejeong Jeong, Suwon-si (KR); Jaekwan Kim, Hwaseong-si (KR); Byonggwon Song, Seoul (KR); Jeongyub Lee, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 117 days.

(21) Appl. No.: 15/668,297

(22) Filed: Aug. 3, 2017

(65) Prior Publication Data
US 2018/0039102 A1 Feb. 8, 2018

(30) Foreign Application Priority Data

Aug. 3, 2016 (KR) .................. 10-2016-0099069

(51) Int. Cl.
G02F 1/01 (2006.01)
G02B 1/00 (2006.01)
(Continued)

(52) U.S. Cl.
CPC .......... G02F 1/0121 (2013.01); G02B 1/002 (2013.01); G02F 1/0054 (2013.01);
(Continued)

(58) Field of Classification Search
CPC ............ G06F 17/5004; G06F 17/5081; G06F 17/5086; B82Y 10/00; B82Y 20/00;
(Continued)

(56) References Cited

U.S. PATENT DOCUMENTS 6,400,744 B1 6/2002 Capasso et al.
6,501,783 B1 12/2002 Capasso et al.
(Continued)

FOREIGN PATENT DOCUMENTS

KR 10-2016-0099069 A 8/2016

OTHER PUBLICATIONS

Arbabi et al., "Subwavelength-thick lenses with high numerical apertures and large efficiency based on high-contrast transmitarrays", Nature Communications 6, Article No. 7069, May 7, 2015. (6 pages total).
(Continued)

Primary Examiner — Collin X Beatty
(74) Attorney, Agent, or Firm — Sughrue Mion, PLLC

(57) ABSTRACT

A method of designing a meta optical device is provided. The method includes: setting, via a processor, design data for arrangement and dimensions of a nanostructure of the meta optical device, according to a function to be implemented by the meta optical device; obtaining a phase change graph with respect to a change in the dimensions; setting a shape dimension region with phase defect in the phase change graph; and substituting a shape dimension with phase defect, which is included in the shape dimension region with phase defect among the dimensions included in the design data, with a substitution value that is outside the shape dimension region with phase defect. Accordingly, a meta optical device having no phase defect is implemented.

30 Claims, 21 Drawing Sheets

(51) Int. Cl.
    *G02F 1/00*           (2006.01)
    *G06F 17/50*         (2006.01)
    *B82Y 10/00*         (2011.01)
    *B82Y 20/00*         (2011.01)

(52) U.S. Cl.
    CPC ........ *G06F 17/5004* (2013.01); *G06F 17/509* (2013.01); *G06F 17/5081* (2013.01); *G06F 17/5086* (2013.01); *B82Y 10/00* (2013.01); *B82Y 20/00* (2013.01); *G02F 2202/30* (2013.01)

(58) Field of Classification Search
    CPC ........ F21V 5/002; F21V 5/046; G02F 1/0054; G02F 1/0063; G02F 1/0072; G02F 1/0081; G02F 1/01; G02F 1/0121; G02F 2202/30; G06T 7/248; G06T 7/521; G02B 1/002; G02B 1/005; G02B 1/007; G02B 1/02; G02B 3/00; H01L 31/02; H01P 7/00; H01P 7/10; H01S 3/05; H01S 3/06; H01S 3/08; H01S 5/183; H01S 5/187
    USPC ......... 359/279, 642; 343/731, 860; 333/175, 333/176, 179; 977/700, 701, 707, 712, 977/715
    See application file for complete search history.

(56) References Cited

U.S. PATENT DOCUMENTS

| | | | |
|---|---|---|---|
| 8,411,375 B2 | 4/2013 | Lenchenkov | |
| 8,848,273 B2 | 9/2014 | Yu et al. | |
| 8,879,158 B2* | 11/2014 | Choi | B82Y 20/00 359/642 |
| 8,952,403 B2 | 2/2015 | Li et al. | |
| 9,103,973 B2 | 8/2015 | Fattal et al. | |
| 9,939,129 B2* | 4/2018 | Byrnes | F21V 5/045 |
| 10,054,839 B1* | 8/2018 | Brener | G02F 1/353 |
| 10,128,387 B1* | 11/2018 | Liu | H01L 31/02327 |
| 10,132,465 B2* | 11/2018 | Byrnes | F21V 5/045 |
| 2010/0097611 A1 | 4/2010 | Song | |
| 2010/0141318 A1 | 6/2010 | Suzuki | |
| 2011/0315898 A1 | 12/2011 | Capasso et al. | |
| 2012/0025185 A1 | 2/2012 | Kasamatsu | |
| 2013/0070459 A1 | 3/2013 | Kim et al. | |
| 2013/0070799 A1 | 3/2013 | Lee et al. | |
| 2014/0034820 A1 | 2/2014 | Fattal et al. | |
| 2014/0263982 A1 | 9/2014 | Shkunov et al. | |
| 2014/0277433 A1 | 9/2014 | Pugh et al. | |
| 2014/0291608 A1 | 10/2014 | Sargent et al. | |
| 2015/0117015 A1 | 4/2015 | Roh et al. | |
| 2015/0123079 A1 | 5/2015 | Kim et al. | |
| 2015/0219806 A1 | 8/2015 | Arbabi et al. | |
| 2015/0325438 A1 | 11/2015 | Cho | |
| 2017/0030773 A1* | 2/2017 | Han | G01J 3/0208 |
| 2017/0082263 A1* | 3/2017 | Byrnes | F21V 5/045 |
| 2017/0084761 A1 | 3/2017 | Cho et al. | |
| 2017/0287151 A1* | 10/2017 | Han | G06T 7/521 |
| 2018/0045953 A1* | 2/2018 | Fan | G02B 27/0012 |
| 2018/0287023 A1* | 10/2018 | Mizuta | H01L 33/58 |
| 2018/0287262 A1* | 10/2018 | Patri | H01Q 13/02 |
| 2018/0341090 A1* | 11/2018 | Devlin | H01L 31/02 |

OTHER PUBLICATIONS

West et al., "All-dielectric subwavelength metasurface focusing lens", Optics Express, vol. 22, No. 21, Oct. 17, 2014, pp. 26212-26221, (https://www.osapublishing.org/oe/abstract.clm?url=oe-22-21-26212). (10 pages total).

Aieta et al., "Multiwavelength achromatic metasurfaces by dispersive phase compensation", Sciencexpress, Feb. 19, 2015, pp. 1-8, sciencemag.org/content/early/recent/. (8 pages total).

Aieta, et al., "Multiwavelength achromatic metasurfaces by dispersive phase compensation", Mar. 20, 2015, Science Magazine, vol. 347, Issue No. 6228, XP055432399, 5 pages total.

Mohammadreza, et al., "Achromatic Metasurface Lens at Telecommunication Wavelengths", Jul. 14, 2015, Nano Letters, vol. 15, Issue No. 8, pp. 5358-5362, XP055432407.

Communication dated Dec. 14, 2017, issued by the European Patent Office in counterpart European Patent Application No. 17183430.2.

\* cited by examiner

META OPTICAL DEVICE AND METHOD OF DESIGNING THE SAME

CROSS-REFERENCE TO RELATED APPLICATION

This application claims priority from Korean Patent Application No. 10-2016-0099069, filed on Aug. 3, 2016, in the Korean Intellectual Property Office, the disclosure of which is incorporated herein in its entirety by reference.

BACKGROUND

1. Field

The present disclosure relates to a meta optical device and a method of designing the same.

2. Description of the Related Art

A meta structure is an artificial structure in which a value less than a wavelength of incident light is applied to a thickness, pattern, period, interval, or the like, and shows optical characteristics that are not exhibited in macroscale objects.

To implement the meta structure, a structure using surface plasmon resonance occurring at an interface between a metal layer and a dielectric layer or a structure using boundary characteristics between dielectric materials having different refractive indices is widely used.

The meta structure exhibits various optical characteristics at a high response speed and is advantageously applied to a subminiature device. Hence, efforts have been made to apply the meta structure to optical devices that change the transmission, reflection, polarization, phase, intensity, path, or the like of incident light.

SUMMARY

Provided are meta optical devices in which shape dimensions of a nanostructure are designed according to optical performance to be implemented, and methods of designing the same.

Additional aspects will be set forth in part in the description which follows and, in part, will be apparent from the description, or may be learned by practice of the presented embodiments.

According to an aspect of an exemplary embodiment, a method of designing a meta optical device may include: setting, via a processor, design data for arrangement and shape dimensions of a nanostructure of the meta optical device, according to a function to be implemented by the meta optical device; obtaining a phase change graph with respect to a change in the shape dimensions; setting a shape dimension region with phase defect in the phase change graph; and substituting a shape dimension with phase defect, which is included in the shape dimension region with phase defect among the dimensions included in the design data, with a substitution value that is outside the shape dimension region with phase defect.

The setting of the shape dimension region with phase defect may correspond to a region where a sign of a slope in the phase change graph reverses.

A range of a dimension included in the shape dimension region with phase defect may be defined by an inequality, $DMIN\_PD < DR\_PD < DMAX\_PD$, a left region of the shape dimension region with phase defect in the phase change graph is a first normal region, and a right region thereof is a second normal region. $DMIN\_PD$ may be a lower limit of the shape dimension region with phase defect, and $DMAX\_PD$ may be an upper limit of the shape dimension region with phase defect. $DMIN\_PD$ and $DMAX\_PD$ may be determined so that a first sign of a slope of a straight line connecting two points of the phase change graph respectively corresponding to $DMIN\_PD$ and $DMAX\_PD$, a second sign of a first average slope of the phase change graph in the first normal region, and a third sign of a second average slope of the phase change graph in the second normal region are equal to one another.

$DMIN\_PD$ and $DMAX\_PD$ may be determined so that the first slope of the straight line connecting the two points of the phase change respectively corresponding to $DMIN\_PD$ and $DMAX\_PD$ has a value between a second slope of the phase change graph at $DMIN\_PD$ and a third slope of the phase change graph at $DMAX\_PD$.

$DMIN\_PD$ and $DMAX\_PD$ may be determined so that the first slope of the straight line connecting the two points of the phase change graph respectively corresponding to $DMIN\_PD$ and $DMAX\_PD$ has a value between a first average slope of the phase change graph in the first normal region and a second average slope of the phase change graph in the second normal region.

The substitution value may be one of $DMIN\_PD$ and $DMAX\_PD$.

A plurality of shape dimension with phase defects may be substituted with one selected from $DMIN\_PD$ and $DMAX\_PD$, where $DMIN\_PD$ is a lower limit of the shape dimension region with phase defect, and $DMAX\_PD$ is an upper limit of the shape dimension region with phase defect.

At least one substitution value that is substituting for a plurality of shape dimensions with phase defect is adjusted to $DMIN\_PD$ when the at least one shape dimension with phase defect is closer to $DMIN\_PD$ than to $DMAX\_PD$, and the at least one substitution value is adjusted to $DMAX\_PD$ when the at least one shape dimension with phase defect is closer to $DMAX\_PD$ than to $DMIN\_PD$.

According to an aspect of another exemplary embodiment, a meta optical device designed by the method described above.

According to an aspect of another exemplary embodiment, a meta optical device includes: a support layer; and a plurality of nanostructures provided above the support layer, the plurality of nanostructures being arranged to form a dimension distribution that changes a phase of incident light with a certain regularity based on positions of the plurality of nanostructures, and having dimension values that are less than a wavelength of the incident light, wherein signs of slopes of a phase change graph showing a phase change of the incident light with respect to the dimension values of the plurality of nanostructures may be consistent.

The dimension values of the plurality of nanostructures may exclude a value included in a shape dimension region with phase defect extracted from the phase change graph of the incident light with respect to the dimension values.

The dimension values of the plurality of nanostructures may exclude a value causing resonance or quasi-resonance with respect to the incident light.

The plurality of nanostructures may have at least one of a cylindrical shape and a polygonal column shape, and the dimension values may comprise at least one of a diameter of a cross-sectional circle of a cylinder and a length of one side of a cross-sectional polygon of a polygonal column.

A protrusion height (t) of the plurality of nanostructures protruding from the support layer may satisfy a condition, $\lambda/(2n_{swg}) < t < \lambda$. $\lambda$ may be the wavelength of the incident light and $n_{swg}$ may be a refractive index of the plurality of nanostructures.

The phase change of the incident light due to the plurality of nanostructures may cover a range of 0 degrees to 360 degrees.

The plurality of nanostructures may include one of a dielectric material and a semiconductor material.

A refractive index of the plurality of nanostructures may be greater than a refractive index of the support layer.

The meta optical device may further include a cover layer covering a surface of each of the plurality of nanostructures in a form of a shell and having a refractive index that is different from a refractive index of the plurality of nanostructures.

The meta optical device may further include a cover layer entirely covering the plurality of nanostructures. The cover layer may have a thickness substantially equal to a height of the nanostructure in a region between the plurality of nanostructures above the support layer, and having a refractive index that is different from the refractive index of the nanostructure.

The refractive index of the cover layer may be substantially equal to a refractive index of the support layer.

The meta optical device may further include an upper dielectric layer arranged above the cover layer and having a refractive index that is different from the refractive index of the cover layer.

The meta optical device may further include a lower dielectric layer arranged between the support layer and the plurality of nanostructures.

The plurality of nanostructures may include a nanostructure forming layer through which a groove is formed and which is arranged above the support layer and including a material having a refractive index that is greater than a refractive index of the support layer.

The meta optical device may further include a lower dielectric layer arranged between the support layer and the nanostructure.

The meta optical device may further include an upper dielectric layer arranged above the cover layer and having a refractive index that is different from the refractive index of the cover layer.

The meta optical device may further include a cover layer filling the groove of the nanostructure forming layer and extending upward from the nanostructure forming layer.

The meta optical device may further include an upper dielectric layer arranged above the cover layer and having a refractive index that is different from a refractive index of the cover layer.

According to an aspect of another exemplary embodiment, an optical apparatus includes the meta optical device described above.

BRIEF DESCRIPTION OF THE DRAWINGS

The above and/or other aspects will become apparent and more readily appreciated from the following description of various exemplary embodiments, taken in conjunction with the accompanying drawings in which.

DETAILED DESCRIPTION

Figure 1:
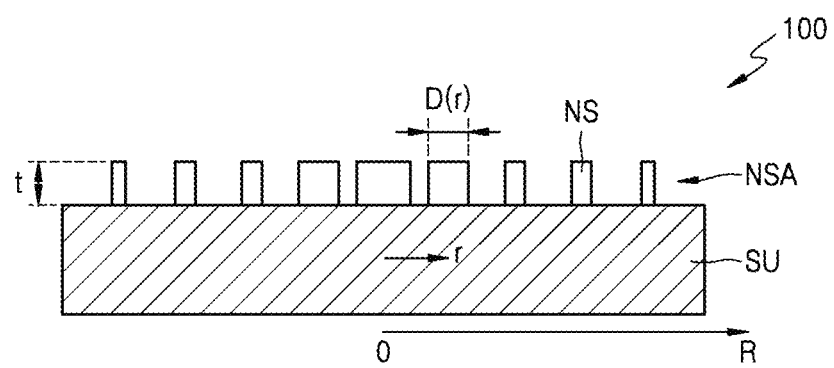
FIG. 1 is a cross-sectional view illustrating a schematic configuration of a meta optical device according to an exemplary embodiment.

Reference will now be made in detail to exemplary embodiments, which are illustrated in the accompanying drawings, wherein like reference numerals refer to like elements throughout. In this regard, the present embodiments may have different forms and should not be construed to be being limited to the descriptions set forth herein. Accordingly, the exemplary embodiments are merely described below, by referring to the figures, to explain aspects.

It will be understood that when a layer, region, or component is referred to as being "formed on" another layer, region, or component, the layer can be directly or indirectly formed on, over, or above the other layer, region, or component. In an exemplary embodiment, "dimension" refers to a length or measure of a referenced object in one direction in a three-dimensional space. For example, a dimension of an object can be the object's width, depth, height, diagonal, diameter, etc. In another exemplary embodiment, "dimension" refers to other measurements that are different from the aforementioned.

As used herein, the singular forms "a," "an," and "the" are intended to include the plural forms as well, unless the context clearly indicates otherwise. It will be further understood that the terms "comprises" and/or "comprising" used herein specify the presence of stated features or components, but do not preclude the presence or addition of one or more other features or components.

As used herein, the term "the" or similar indicative terms correspond to both the singular form and the plural form. Operations constituting a method may be performed in an appropriate order, unless operations clearly indicate otherwise. The method is not limited to the order of operations described herein. The use of any and all examples, or exemplary language (e.g., "such as") provided herein, is intended merely to better illuminate the underlying concept and does not pose a limitation on the scope of the disclosure.

Figure 2:
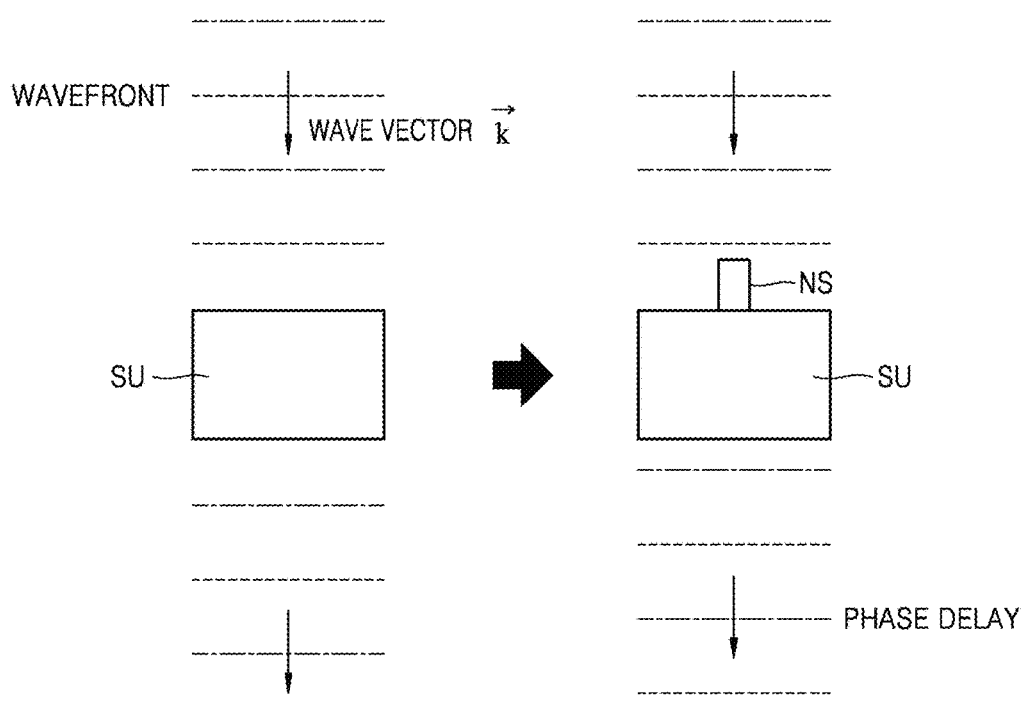
FIG. 2 is a conceptual diagram of a phase delay caused by a nanostructure used in the meta optical device according to an exemplary embodiment.

FIG. 1 is a cross-sectional view illustrating a schematic configuration of a meta optical device 100 according to an exemplary embodiment. FIG. 2 is a conceptual diagram showing phase delay caused by a nanostructure NS used in the meta optical device 100 according to the exemplary embodiment.

Referring to FIG. 1, the meta optical device 100 may include a support layer SU and a nanostructure array NSA. The nanostructure array NSA may include a plurality of nanostructures NS arranged above the support layer SU.

The nanostructures NS may have a dimension of a sub-wavelength. The nanostructure NS may have a cylindrical shape, of which a height is t and a diameter of a cross-sectional circle is D, but is not limited thereto. The dimension of the sub-wavelength means that at least one dimension defining the shape of the nanostructure NS is less than an operating wavelength of the meta optical device 100. For example, when the nanostructure NS has a cylindrical shape, the height t of the nanostructure NS or the diameter D of the cross-sectional circle may have a dimension that is less than the operating wavelength of the meta optical device 100. When the nanostructure NS is a polygonal shape, a length of one side or a diagonal length in a cross-sectional polygon may be less than the operating wavelength of the meta optical device 100.

Referring to FIG. 2, a position of a wavefront, which is the locus of points having the same phase, after passing through the structure where the nanostructure NS having the sub-wavelength dimension is formed on the support layer SU, is different from the position of the wavefront after passing through a structure that has only the support layer SU, because the nanostructure NS having the sub-wavelength dimension changes a phase of light passing through the nanostructure NS. This is a phase delay caused by the nanostructure NS having the sub-wavelength dimension, and the degree of phase delay is determined by specific dimensions of the nanostructure NS, such as a diameter of the nanostructure NS. Therefore, when a plurality of nanostructures NS are provided, various optical functions may be achieved by appropriately setting the delay of phase delay occurring in each of the nanostructures NS.

The nanostructures NS may be arranged so that a phase of incident light is changed with a certain regularity according to a position. The shape dimension at each position is determined according to optical performance to be implemented by the meta optical device 100. For example, when a position r of the nanostructure NS is defined by a distance from the center of the meta optical device 100 in a radial direction, a diameter of the nanostructure NS disposed at the position r may be represented by D(r). The meta optical device 100 and the support layer SU may be circular (e.g., disc-shaped). The meta optical device 100 according to an exemplary embodiment has a shape dimension and an arrangement so as to function as a convex lens, that is, so as to focus light with positive refractive power. As illustrated, a value of D is reduced as the distance from the center of the meta optical device 100 in the radial direction increases (e.g., moving from the center of the disc-shaped metal optical device 100 towards a rim of the disc), and the shown regularity may be repeated in the radial direction. The repeated periods (e.g., repeating intervals) may not be consistent and may be changed. The arrangement of the nanostructure array NSA may be periodic or quasi-periodic.

Since the degree of the convex lens function implemented by the meta optical device 100, that is, the refractive power or focal length, is adjusted by the dimension applied to D(r) according to the position r of the nanostructure NS, an increase in volume due to an increase in refractive power is not caused, as compared to an conventional lens that adjusts refractive power through curvature.

The dimensions of the nanostructures NS used in the meta optical device 100 are determined according to optical performance to be implemented. Also, the effects of each dimension may be analyzed in detail, and values substituted with values showing no phase defect are applied to the nanostructures NS. A detailed method thereof will be described below with reference to a design method of FIGS. 3 to 12.

The nanostructure NS may include a dielectric or semiconductor material. The nanostructure NS may include one selected from $SiO_2$, SiC, $TiO_x$, $SiN_x$, ITO, Si, a-Si, p-Si, and a group III-V semiconductor compound. A refractive index of the nanostructure NS may be greater than that of the support layer SU.

The support layer SU may include a material having a refractive index less than that of the nanostructure NS, and there is no particular limitation otherwise. The support layer SU may include, for example, a transparent material. For example, glass, $SiO_2$, or a polymer material, such as polymethylmethacrylate (PMMA) or polydimethylsiloxane (PDMS), may be used for the support layer SU. Alternatively, silicon may be used as the material of the support layer SU according to a wavelength of incident light.

The support layer SU may also include a reflection layer that reflects incident light, a light-emitting element that generates light, or an optical element that performs an additional optical function.

A protrusion height t of the nanostructure NS protruding from the support layer SU may satisfy the following condition:

$$\lambda/(2n_{swg}) < t < \lambda,$$

where λ is the operating wavelength of the meta optical device 100 and $n_{swg}$ is the refractive index of the nanostructure NS.

The plurality of nanostructures NS are illustrated as having the same height, but this is only for illustrative purposes. The plurality of nanostructures NS are not limited thereto. The heights of the nanostructures NS may be changed within a range of the sub-wavelength. For example, the nanostructures NS may have a stepped height distribution.

A phase change range of incident light due to the plurality of nanostructures NS may cover a range of about 0 degrees to about 360 degrees.

Hereinafter, a method of designing a meta optical device, according to an exemplary embodiment, will be described with reference to FIGS. 3 to 12.

Figure 3:
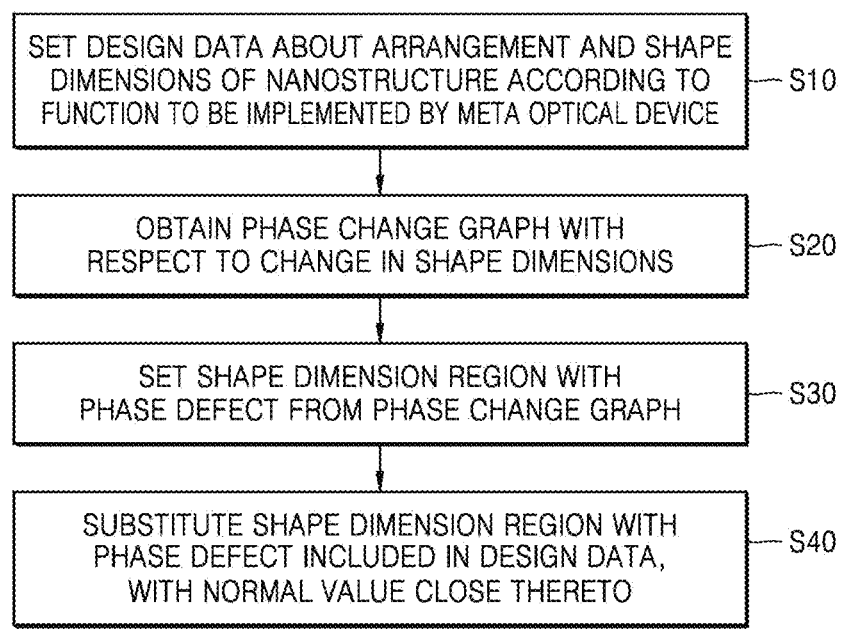
FIG. 3 is a flowchart of a method of designing a meta optical device, according to an exemplary embodiment.

FIG. 3 is a flowchart of a method of designing a meta optical device, according to an exemplary embodiment.

In operation S10, design data about arrangement and dimensions of a nanostructure NS to be used in the meta optical device is set according to a function to be implemented by the meta optical device. The design data refers to a collection of one or more numerical values that define the characteristics of the nanostructure NS.

Operation S10 may be an operation of determining the shape of the nanostructure NS and then determining a dimension suitable according to an arrangement position by selecting one of the dimensions. For example, a method of determining a cylindrical shape as the shape of the nanostructure NS and determining a diameter distribution according to a position may be used. However, the exemplary embodiment is not limited thereto. A method of determining a polygonal shape as the shape of the nanostructure NS and determining a distribution according to a position with respect to a length of one side of a polygon or a diagonal length of the polygon may be used. Alternatively, a method of determining a distribution according to a position with respect to a height of the nanostructure NS may be used.

Figure 4:
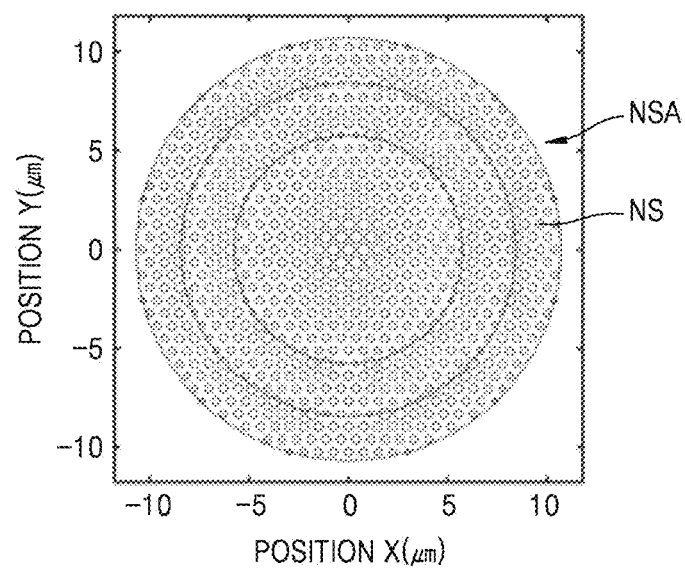
FIG. 4 is a plan view showing example design data that determines an arrangement and shape of a nanostructure so as to perform a convex lens function.
Figure 5:
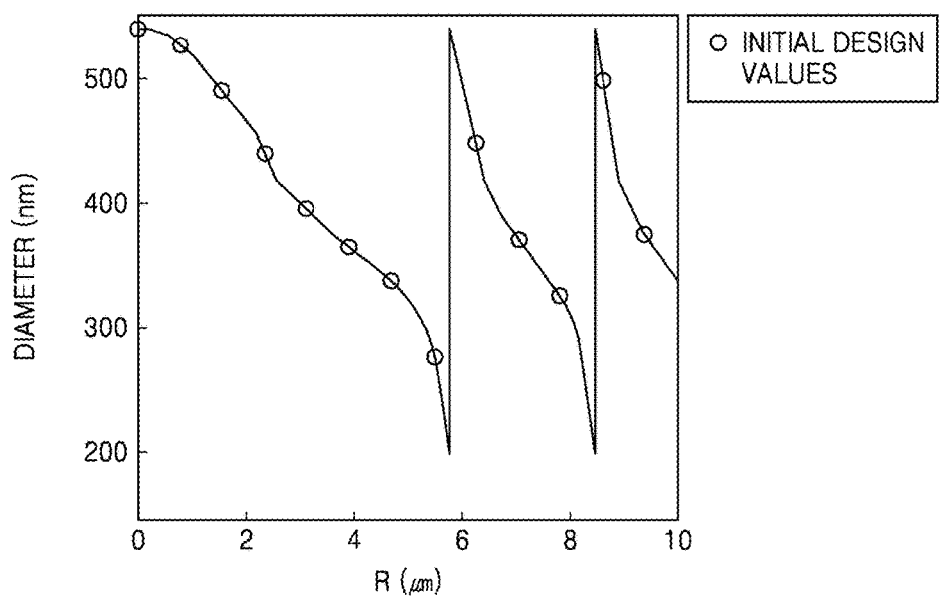
FIG. 5 is a graph showing a diameter of the nanostructure according to a position of the nanostructure in the plan view of FIG. 4.

FIG. 4 is a plan view showing example design data that determines an arrangement and shape of the nanostructure NS so as to function as a convex lens, and FIG. 5 is a graph showing diameters of the nanostructure NS according to the position r of the nanostructure NS in the plan view of FIG. 4.

In the graph of FIG. 5, the position r is a radial direction defined in the plan view of FIG. 4.

In operation S20, a phase change graph with respect to a change in the dimensions determined as above is obtained. In order to obtain the phase change graph, a computer simulation or the like may be used. Since the phase change graph is used to set a shape dimension region with phase defect, the numerical range included in the design data may be subdivided as much as possible and a phase change analysis may be performed thereon.

Figure 6:
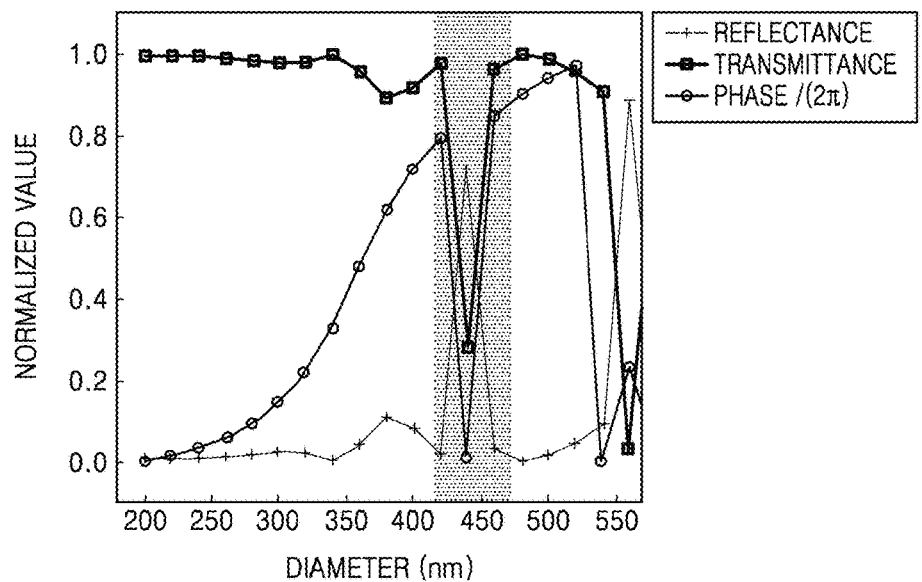
FIG. 6 is a graph showing a phase change, transmittance, and reflectance according to the diameter of the nanostructure.

FIG. 6 is a graph showing a computer simulation of a phase change, transmittance, and reflectance according to a diameter of the nanostructure NS. In the graph, the phase change is shown as phase/2π for expression as a normalized value. A wavelength of light used in the computer simulation is 1.55 μm.

Referring to the graph, as the transmittance decreases rapidly, the reflectance rapidly increases, and the phase change rapidly occurs, in a range of about 410 nm to about 460 nm. A sign of a slope of the phase change in this region changes (i.e., reverses), and in a next region, the slope of the phase change has the same sign as that in a region prior to this region. Considering a pattern of the change in the transmittance and the reflectance, this region may be construed to be a region including a dimension causing resonance or quasi-resonance.

Operations S10 and S20 have been described as being sequentially performed in this order, but exemplary embodiments are not limited to this order. For example, when the shape of the nanostructure to be used in the meta optical device is determined, operation S20 may be performed before design data about the detailed arrangement and size of the nanostructure is set, that is, before operation S10 is completed. Alternatively, operation S20 may be performed in advance before operation S10 or in parallel with operation S10. After a phase change graph is obtained in advance by changing dimensions with respect to various shapes of nanostructures, for example, a cylinder, a polygonal column, or the like, design data may be set in operation S10. Operation S10 and operation S20 may be performed at the same time.

In operation S30, a shape dimension region with phase defect is set from the phase change graph.

Figure 7A:
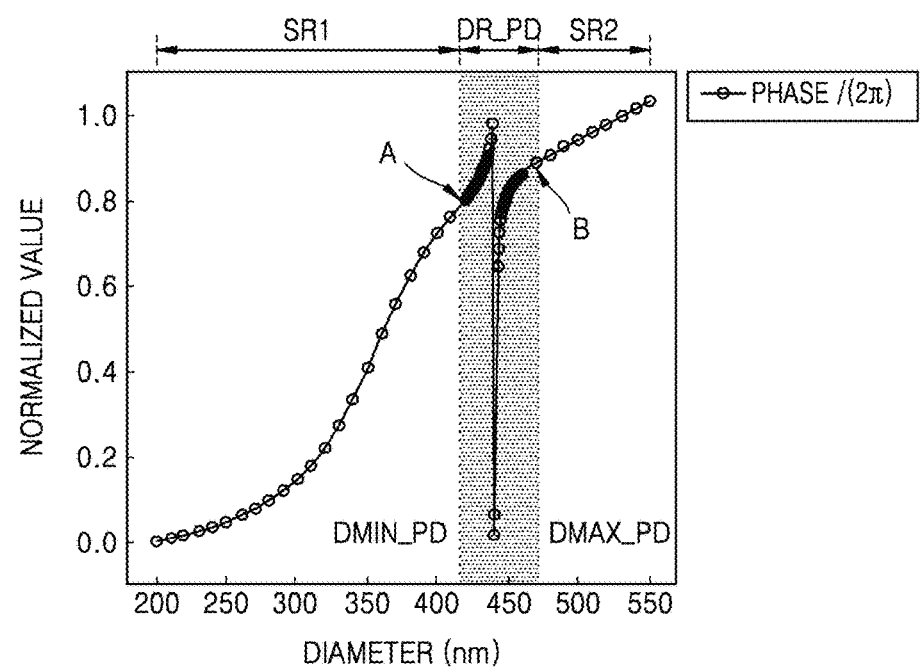
FIG. 7A is a graph showing a shape dimension region with phase defect set from the graph of FIG. 6, and FIGS. 7B, 7C, and 7D are conceptual graphs for describing a method of setting a shape dimension region with phase defect.

FIG. 7A is a graph showing the shape dimension region with phase defect set from the phase change graph. At this time, data is obtained by further subdividing the shape dimension region with phase defect illustrated in FIG. 6.

Referring to the graph, the phase change gradually increases, rapidly increases, and rapidly decreases to form a local minimum point after reaching a local maximum point, and then, rapidly increases again, and the rate of increase gradually decreases. In terms of the sign of the slope, the phase change graph changes as follows: positive, negative, and positive.

By taking into account the change in the sign of the slope, the shape dimension region with phase defect DR_PD may be determined to have a certain width including a region where the sign of the slope changes in the phase change graph, and the certain width may be determined to include a region where the phase change relatively rapidly changes, as compared to other regions.

The shape dimension region with phase defect DR_PD may be defined by the following range:

DMIN_PD<DR_PD<DMAX_PD.

"DMIN_PD" and "DMAX_PD" are numerals which respectively indicating a lower limit and an upper limit of the shape dimension region with phase defect DR_PD and may be values adjacent to the shape dimension region with phase defect DR_PD while not being included in the shape dimension region with phase defect DR_PD. In other words, DMIN_PD and DMAX_PD may be normal values close to the shape dimension region with phase defect DR_PD. Therefore, these values may be substitution values that substitute shape dimension with phase defects included in the design data in operation S40.

When assuming that a left region of the shape dimension region with phase defect DR_PD, i.e., a region having a value less than the dimension (e.g., diameter) of the shape dimension region with phase defect DR_PD, is a first normal region SR1 and a right region of the shape dimension region with phase defect DR_PD, i.e., a region having a value that is greater than the shape dimension of the shape dimension region with phase defect DR_PD, is a second normal region SR2, a slope of a straight line connecting two points A and B respectively corresponding to DMIN_PD and DMAX_PD on the phase change graph may be determined so as to satisfy certain requirements in a relationship between the phase change graph in the first normal region SR1 and the phase change graph in the second normal region SR2.

Figure 7B:
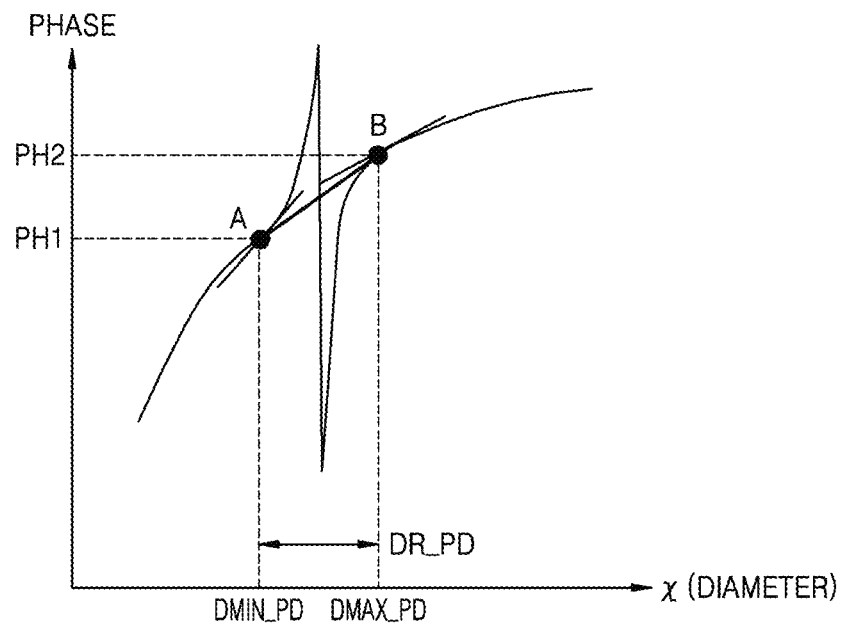

As illustrated in FIG. 7B, DMIN_PD and DMAX_PD may be determined (e.g., selected) so that the first normal region SR1 may make a smooth transition to the second normal region SR2 (e.g., with no sign change of the slope). In this example, DMIN_PD and DMAX_PD may be determined so that the sign of the slope of the straight line connecting the two points A and B respectively corresponding to DMIN_PD and DMAX_PD on the phase change graph, the sign of an average slope of the graph in the first normal region SR1, and the sign of an average slope of the graph in the second normal region SR2 may be substantially equal to one another.

As another example, the shape dimension region with phase defect may be determined to have a certain width including a region where the sign of the slope in the phase change graph changes. In this case, a phase slope value between DMIN_PD and DMAX_PD determining the certain width may be determined to be between phase slope values at DMIN_PD and DMAX_PD.

Figure 7C:
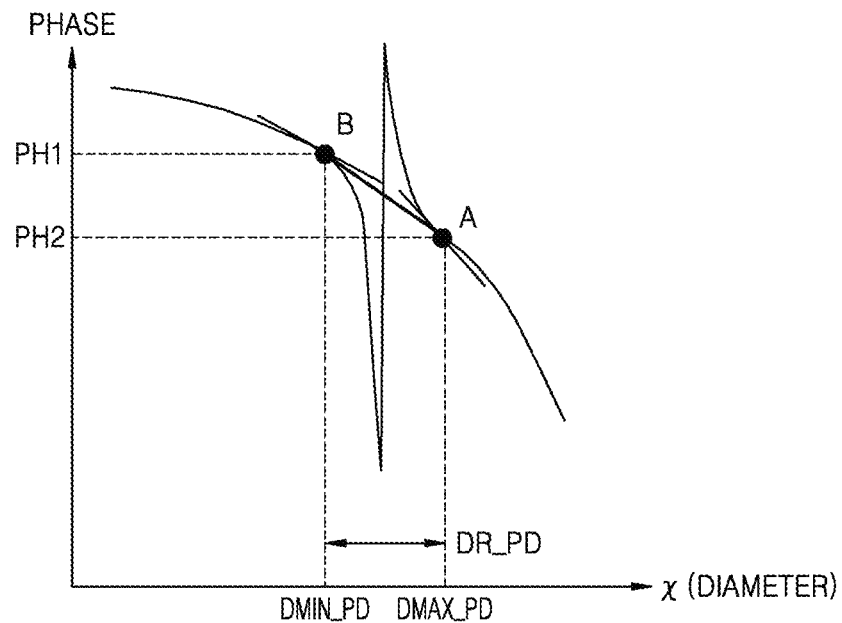
Figure 7D:
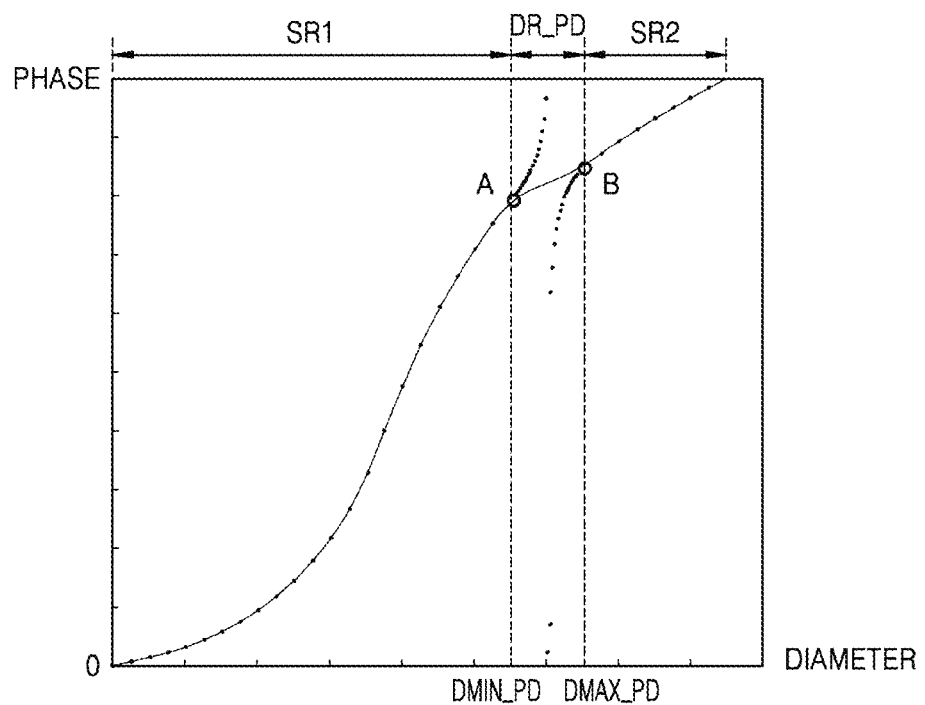

That is, in the phase change graphs shown in FIG. 7B or 7C, when phase values corresponding to DMIN_PD and DMAX_PD are respectively PH1 and PH2, DMAX_PD and DMIN_PD may be determined to satisfy the following condition:

$$\left(\frac{d(\text{Phase})}{dx}\right)\bigg|_{x=DMAX\_PD} < \frac{PH2 - PH1}{DR\_PD} < \frac{d(\text{Phase})}{dx}\bigg|_{x=DMIN\_PD}.$$

Alternatively, a slope value between DMIN_PD and DMAX_PD determining the certain width of the shape dimension region with phase defect may be determined to be equal to or similar to one of the slope values at DMIN_PD and DMAX_PD.

As another example, DMIN_PD and DMAX_PD may be determined so that the slope of the straight line connecting the two points A and B respectively corresponding to DMIN_PD and DMAX_PD on the phase change graph has a value between an average slope of the graph in the first normal region SR1 and an average slope of the graph in the second normal region SR2.

A method of determining DMIN_PD and DMAX_PD is not limited to the above-described examples. DMIN_PD and DMAX_PD may be determined by other modified methods of defining a region having a rapid phase change as a shape dimension region with phase defect. For example, the average slope in the corresponding region may be determined by setting the region determining the average slope to have the same width as the shape dimension region with phase defect DR_PD, not the entire first normal region SR1 or the entire second normal region SR2. The average slopes may be compared with each other to determine DMIN_PD and DMAX_PD so that the slope of the straight line connecting the two points respectively corresponding to DMIN_PD and DMAX_PD has a value between the slopes in the corresponding regions. Thus, by various means of adjustment described above, the resulting phase change graph may represent a monotonic function (e.g., monotonically increasing or monotonically decreasing). In other words, diameters of the plurality of nanostructures may be selected such that a phase change distribution of the plurality of nanostructures from the center of the meta optical device to the rim of the meta optical device in a radial direction is monotonic.

In operation S40, when the shape dimension region with phase defect is set, the shape dimension with phase defect included in the design data is substituted with a normal value (e.g., a value in a normal region other than the shape dimension region with phase defect DR_PD) close thereto.

For example, when comparing the diameter value in the graph of FIG. 5 showing the initial design values and the diameter values included in the shape dimension region with phase defect in the graph of FIG. 6, the design data includes a value of about 440 nm included in the shape dimension region with phase defect. Since this value is a value causing a rapid change on the phase change graph, this value is not used and is substituted with a normal value close thereto. As the normal value close to the shape dimension region with phase defect DR_PD, DMIN_PD or DMAX_PD used to set the shape dimension region with phase defect DR_PD may be used. This value may be regarded as the normal value closest to the shape dimension region with phase defect (DR_PD).

Figure 8:
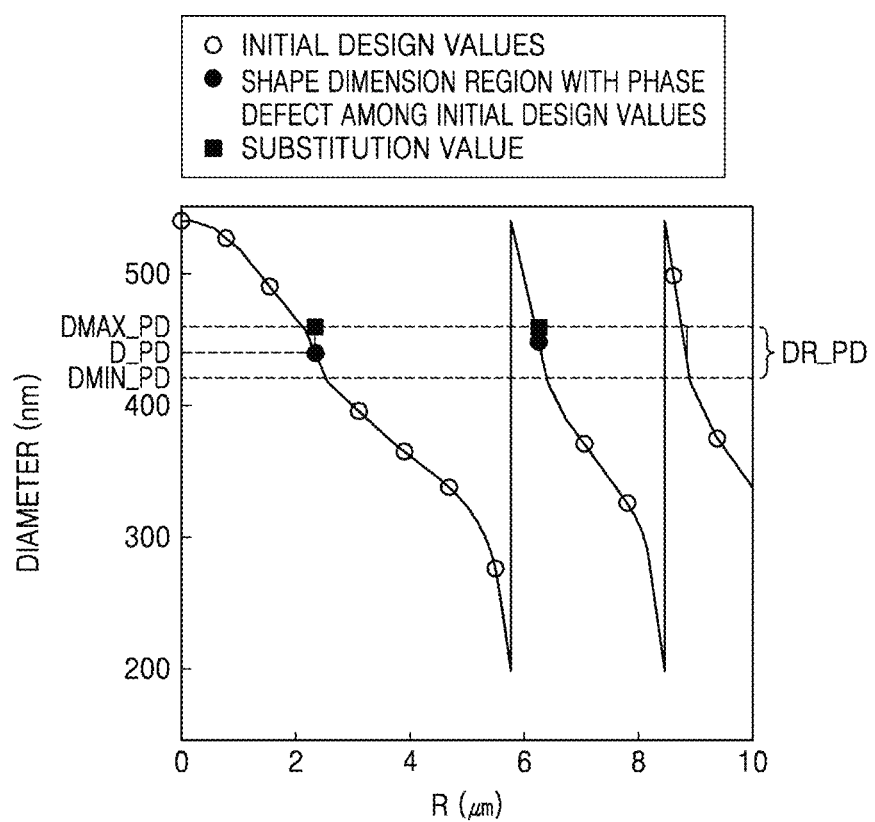
FIG. 8 is a graph showing an example in which a shape dimension with phase defect included in the graph of FIG. 7A is substituted with a normal value in the graph of FIG. 5.
Figure 9:
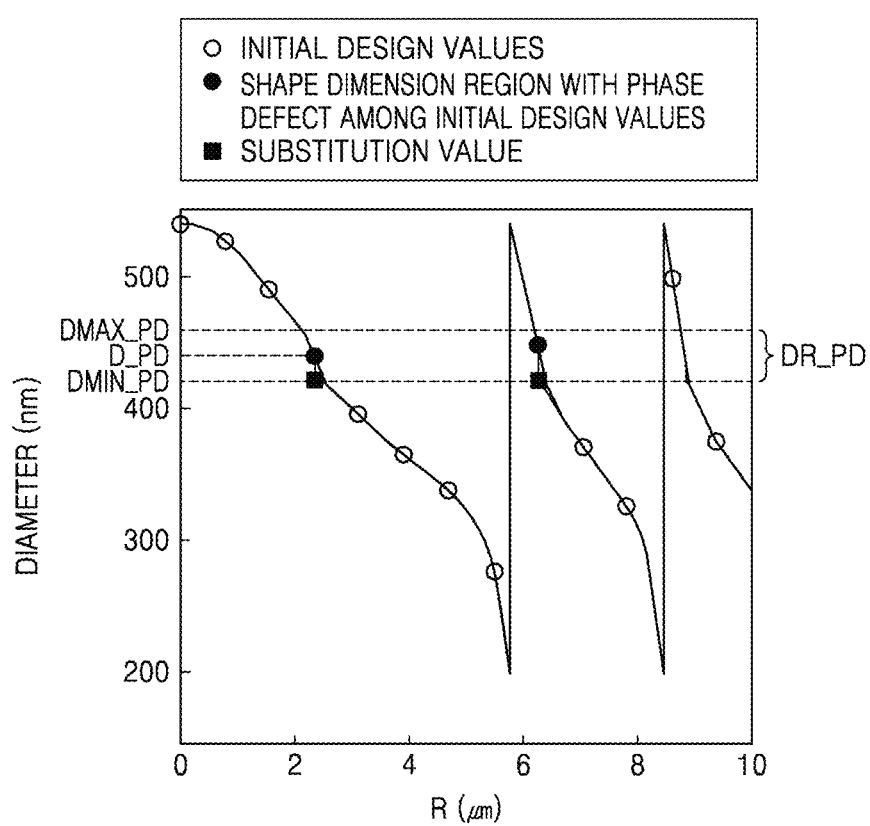
FIG. 9 is a graph showing another example in which a shape dimension with phase defect included in the graph of FIG. 7A is substituted with a normal value in the graph of FIG. 5.

FIG. 8 is a graph showing an example in which a shape dimension with phase defect included in the graph of FIG. 7A is substituted with a normal value in the graph of FIG. 5, and FIG. 9 is a graph showing another example in which a shape dimension with phase defect included in the graph of FIG. 7A is substituted with a normal value in the graph of FIG. 5.

Referring to FIG. 8, D_PD, which is a value included in the shape dimension region with phase defect DR_PD, is substituted with DMAX_PD. Referring to FIG. 9, D_PD, which is a value included in the shape dimension region with phase defect DR_PD, is substituted with DMIN_PD.

A case where one value is included in the shape dimension region with phase defect DR_PD among the design data has been described, but a plurality of values may be included in the shape dimension region with phase defect DR_PD among the design data.

Figure 10:
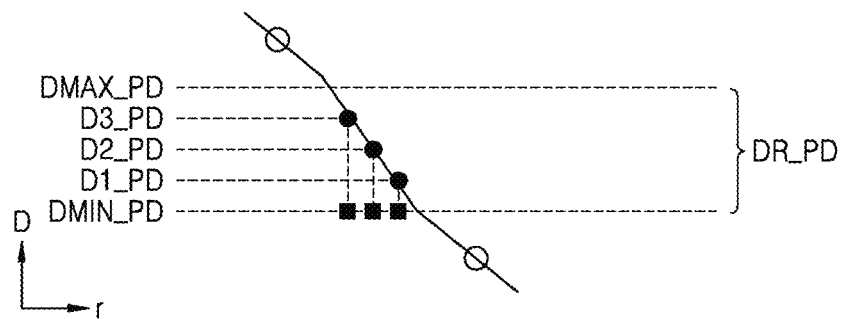
FIGS. 10 to 12 illustrate examples of, when a plurality of values are included in a shape dimension region with phase defect, substituting the plurality of values with normal values.
Figure 11:
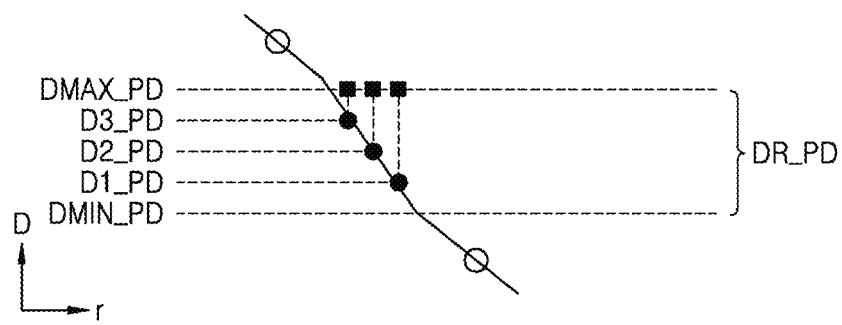
Figure 12:
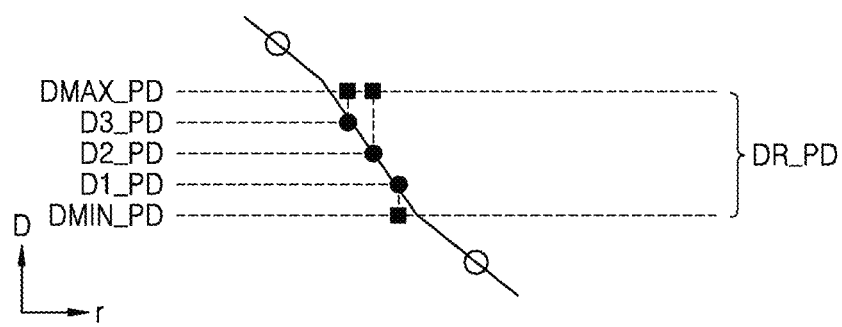

FIGS. 10 to 12 illustrate examples in which a plurality of values are included in a shape dimension region with phase defect and are substituted with normal values.

FIGS. 10 to 12 are partial enlarged views of a shape dimension region with phase defect DR_PD and a normal region adjacent thereto. As in FIGS. 8 and 9, the horizontal axis indicates a radial direction defined on the plan view of FIG. 4, and the vertical axis indicates a diameter of a nanostructure NS.

Referring to FIG. 10, all of D1_PD_PD, D2_PD_PD, and D3_PD_PD, which are values included in the shape dimension region with phase defect DR_PD among the design data, may be substituted with one normal value, i.e., the same normal value. All of D1_PD, D2_PD, and D3_PD may be substituted with DMIN_PD.

Referring to FIG. 11, all of D1_PD, D2_PD, and D3_PD, which are values included in the shape dimension region with phase defect DR_PD among the design data, may be substituted with one normal value, i.e., the same normal value. All of D1_PD, D2_PD, and D3_PD may be substituted with DMAX_PD. As such, D1_PD, D2_PD, and D3_PD may be substituted with the closest normal value.

Referring to FIG. 12, D1_PD, D2_PD, and D3_PD, which are values included in the shape dimension region with phase defect DR_PD among the design data, may be substituted with different normal values. For example, D1_PD may be substituted with DMIN_PD, and D2_PD and D3_PD may be substituted with DMAX_PD.

Figure 13:
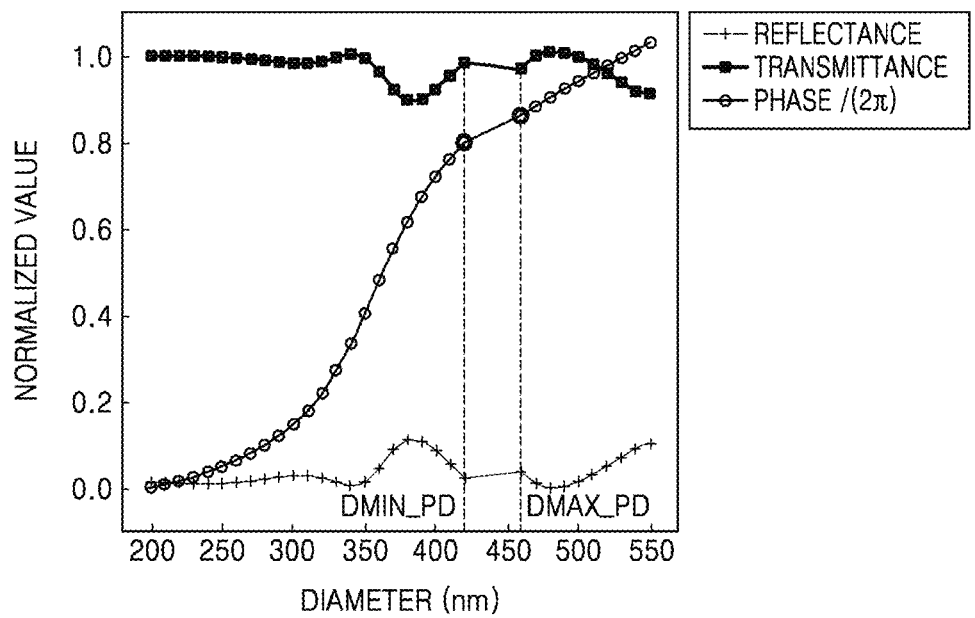
FIG. 13 is a graph showing a phase change, transmittance, and reflectance according to a diameter of the nanostructure of the meta optical device according to an exemplary embodiment.

FIG. 13 is a graph showing a phase change, transmittance, and reflectance according to diameters of the nanostructure NS of the meta optical device 100 according to an exemplary embodiment.

Referring to the graph, the value included in the shape dimension region with phase defect DR_PD is not used as the diameter of the nanostructure NS of the meta optical device 100 and is substituted with DMIN_PD or DMAX_PD that is a value of a normal region. Thus, as shown in the graph of FIG. 6, a rapid increase or decrease in a phase change and a rapid increase or decrease in transmittance or reflectance, which have occurred due to a shape dimension with phase defect, dose not happen. This is a result obtained by excluding a shape value causing a phase defect or a value causing resonance or quasi-resonance with respect to incident light. The slope of the phase change gradually increases and then decreases, and the sign of the slope is consistent without change in the entire region with respect to the shape dimensions applied to the meta optical device 100. Also, the range of the phase change covers a range from about 0 to about 1, that is, uniformly includes a phase change of about 0 degrees to about 360 degrees.

Figure 14:
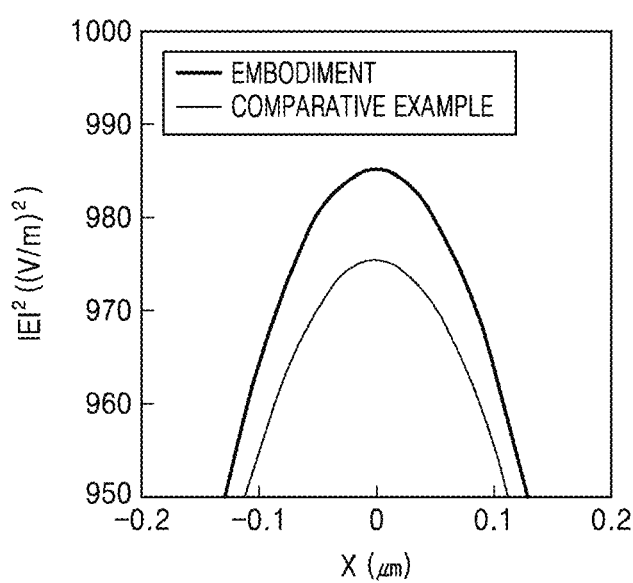
FIG. 14 is a graph showing a magnitude distribution of an electric field intensity of light focused by the meta optical device according to the embodiment, when compared with a comparative example.

FIG. 14 is a graph showing a magnitude distribution of an electric field intensity of light focused by the meta optical device according to an exemplary embodiment, when compared with a comparative example.

The comparative example is a case where the shape dimension with phase defect is not excluded and is applied to the meta optical device, that is, a case where a diameter for each position of the nanostructure is applied by using the initial design values.

In the exemplary embodiment, however, the intensity of electric field is higher at a focused central position, as compared to the comparative example. Thus, excellent optical performance may be obtained because the defect value is excluded.

Figure 15:
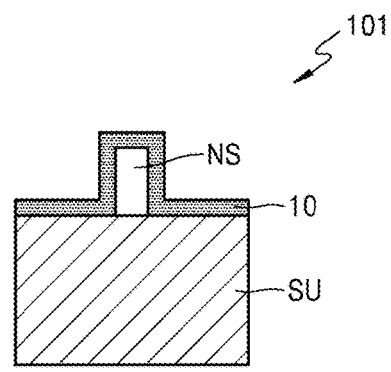
FIG. 15 is a cross-sectional view illustrating a unit configuration of a meta optical device according to another exemplary embodiment.

FIG. 15 is a cross-sectional view illustrating a unit configuration of a meta optical device 101 according to another exemplary embodiment.

The meta optical device 101 may include a support layer SU, a nanostructure NS, and a cover layer 10. The nanostructure NS may be arranged above the support layer SU, have a refractive index different from that of the support layer SU, and have a shape dimension of a sub-wavelength. The cover layer 10 covers the surface of the nanostructure NS in a form of a shell and has a refractive index different from that of the nanostructure NS. The refractive index of the cover layer 10 may be substantially equal to the refractive index of the support layer SU. A material of the cover layer 10 may be substantially equal to a material of the support layer SU.

Figure 16:
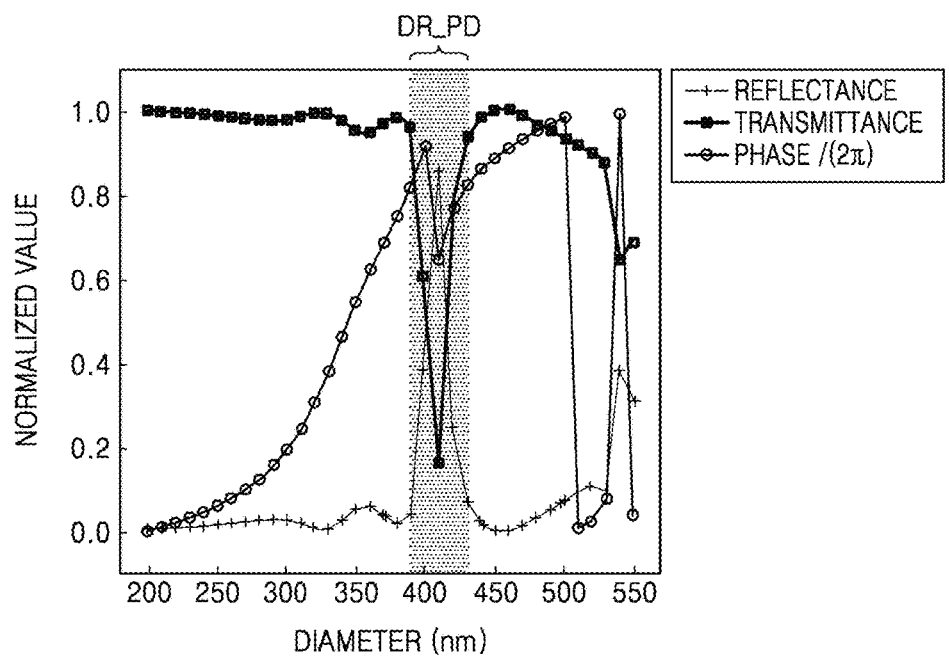
FIG. 16 is a graph showing a phase change according to a diameter of a nanostructure used in the meta optical device of FIG. 15.

FIG. 16 is a graph showing a phase change according to a diameter of the nanostructure NS used in the meta optical device 101 of FIG. 15.

Referring to the graph, a shape dimension region with phase defect DR_PD, in which a phase change, transmittance, and reflectance rapidly change, is shown. A position of the shape dimension region with phase defect DR_PD is different from that in the graph of FIG. 6 showing the case where the cover layer 10 is not present. The shape dimension region with phase defect DR_PD is shifted to a section in which the diameter of the nanostructure NS is small.

Figure 17:
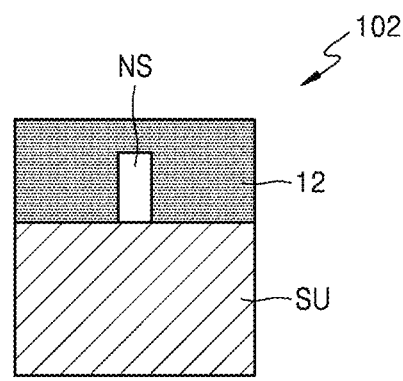
FIG. 17 is a cross-sectional view illustrating a unit configuration of a meta optical device according to another exemplary embodiment.

FIG. 17 is a cross-sectional view illustrating a unit configuration of a meta optical device 102 according to another exemplary embodiment.

The meta optical device 102 may include a support layer SU, a nanostructure NS, and a cover layer 12. The nanostructure NS may be arranged above the support layer SU, have a refractive index different from that of the support layer SU, and have a shape dimension of a sub-wavelength. The cover layer 12 entirely covers the nanostructure NS and has a refractive index different from that of the nanostructure NS. The refractive index of the cover layer 12 may be substantially equal to the refractive index of the support layer SU.

Figure 18:
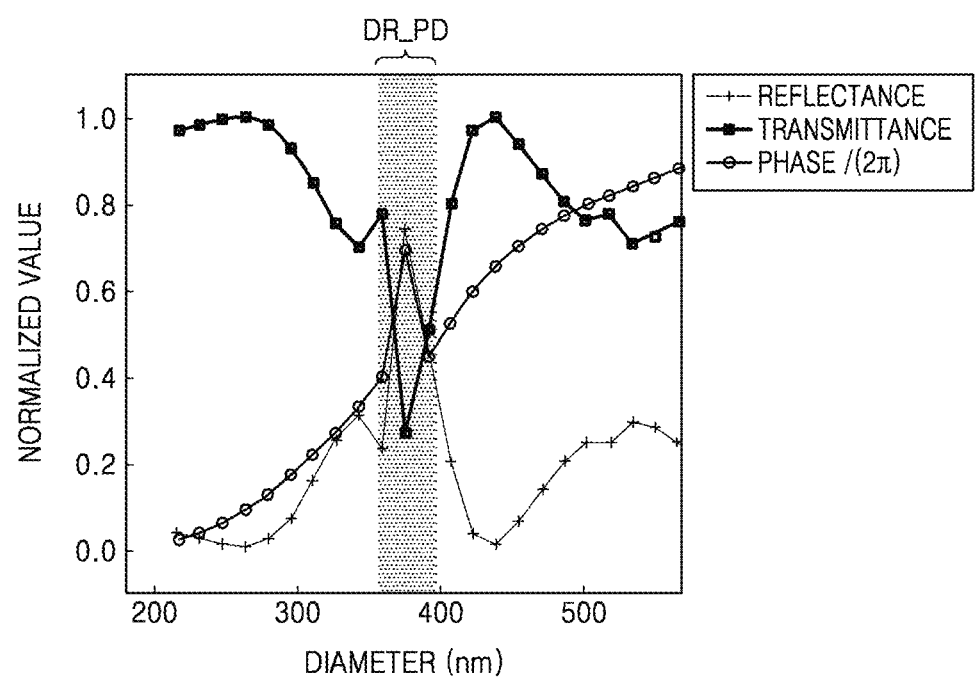
FIG. 18 is a graph showing a phase change according to a diameter of a nanostructure used in the meta optical device of FIG. 17.

FIG. 18 is a graph showing a phase change according to a diameter of the nanostructure NS used in the meta optical device 102 of FIG. 17.

Referring to the graph, a shape dimension region with phase defect DR_PD, in which a phase change, transmittance, and reflectance rapidly change, is shown. A position of the shape dimension region with phase defect DR_PD is different from that in the graph of FIG. 6 showing the case where the cover layer 10 is present in the form of the shell. The shape dimension region with phase defect DR_PD is shifted to a section in which the diameter of the nanostructure NS is small.

As such, the range or position of the shape dimension region with phase defect DR_PD may be changed according to the addition or shape of the cover layer 10 or 12, and the change in the shape dimension region with phase defect DR_PD may be reflected according to the optical performance to be implemented by the meta optical device.

Hereinafter, unit configurations of the meta optical devices according to various embodiments will be described.

Figure 19:
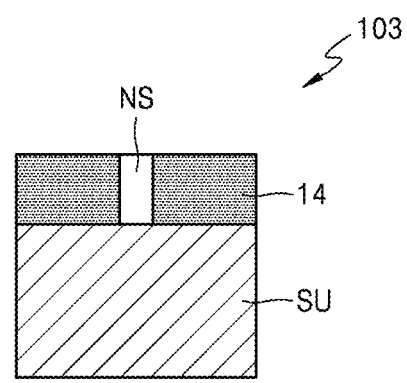
FIGS. 19 to 26 are cross-sectional views illustrating unit configurations of meta optical devices according to various exemplary embodiments.

Referring to FIG. 19, a meta optical device 103 may include a support layer SU, a plurality of nanostructures NS, and a cover layer 14. The plurality of nanostructures NS may be arranged above the support layer SU. The cover layer 14 may be arranged between the nanostructures NS, have the same thickness (i.e., height) as that of the nanostructure NS, and have a refractive index different from that of the nanostructure NS. The refractive index of the cover layer 14 may be substantially equal to the refractive index of the support layer SU. A material of the cover layer 14 may be substantially equal to a material of the support layer SU.

Figure 20:
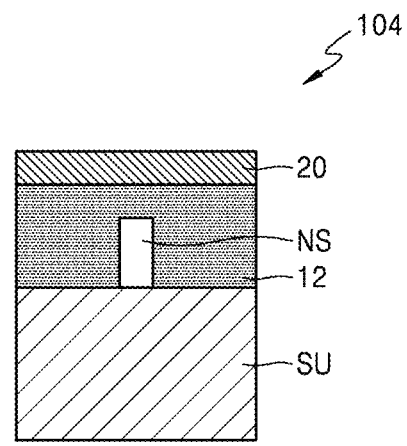

Referring to FIG. 20, a meta optical device 104 may include a support layer SU, a nanostructure NS, a cover layer 12, and an upper dielectric layer 20. The nanostructure NS may be arranged above the support layer SU, have a refractive index different from that of the support layer SU, and have a sub-wavelength dimension. The cover layer 12 may entirely cover the nanostructure NS and have a refractive index different from that of the nanostructure NS. The upper dielectric layer 20 may be arranged above the cover layer 12. The refractive index of the cover layer 12 may be substantially equal to the refractive index of the support layer SU. The refractive index of the upper dielectric layer 20 may be different from the refractive index of the cover layer 12.

Figure 21:
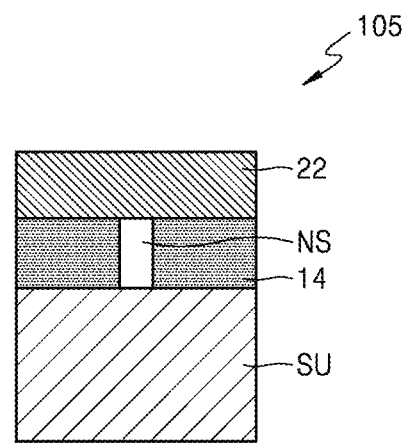

Referring to FIG. 21, a meta optical device 105 may include a support layer SU, a plurality of nanostructures NS, a cover layer 14, and an upper dielectric layer 22. The plurality of nanostructures NS may be arranged above the support layer SU. The cover layer 14 may be arranged between the nanostructures NS, have the same thickness (i.e., height) as that of the nanostructure, and have a refractive index different from that of the nanostructure NS. The upper dielectric layer 22 may be arranged above the cover layer 14 and have a refractive index different from that of the cover layer 14. The cover layer 14 may have the same refractive index as that of the support layer SU. The upper dielectric layer 22 may have a refractive index different from that of the cover layer 14.

Figure 22:
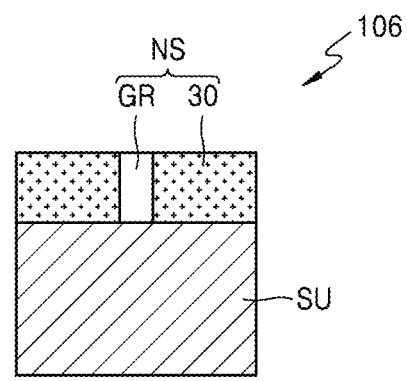

A meta optical device 106 of FIG. 22 may differ from the meta optical devices described in the previous exemplary embodiments, in that a nanostructure NS has a reverse form of the nanostructures of the previous exemplary embodiments. That is, the nanostructure NS is configured so that a groove region GR is formed in a nanostructure forming layer 30 provided above the support layer SU and having a refractive index greater than that of the support layer SU. The groove region GR may have various shapes, such as a cylinder or a polygonal column, which has a dimension of a sub-wavelength.

Figure 23:
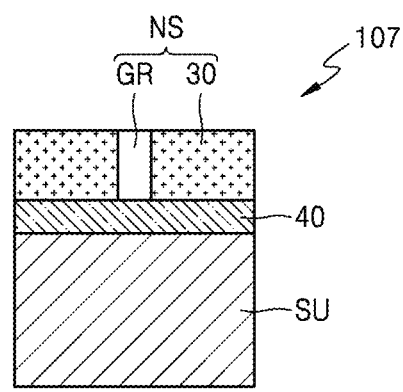

Referring to FIG. 23, a meta optical device 107 may further include a lower dielectric layer 40 in the meta optical device 106 of FIG. 22. That is, the meta optical device 107 may include the support layer SU, the nanostructure NS, and the lower dielectric layer 40. The nanostructure NS may include a nanostructure forming layer 30 and a groove region GR arranged above the support layer SU. The lower dielectric layer 40 may be arranged between the nanostructure NS and the support layer SU. A refractive index of the lower dielectric layer 40 may be different from a refractive index of the nanostructure forming layer 30 and may also be different from a refractive index of the support layer SU.

Figure 24:
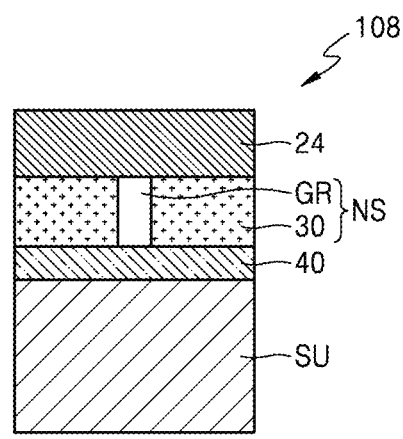

Referring to FIG. 24, a meta optical device 108 may further include an upper dielectric layer 24 in the meta optical device 107 of FIG. 23. That is, the meta optical device 108 may include the support layer SU, the nanostructure NS, the lower dielectric layer 40, and the upper dielectric layer 24. The nanostructure NS may include the nanostructure forming layer 30 arranged above the support layer SU, and the groove region GR arranged in the nanostructure forming layer 30. The lower dielectric layer 40 may be arranged between the nanostructure NS and the support layer SU. The upper dielectric layer 24 may be arranged above the nanostructure forming layer 30. A refractive index of the lower dielectric layer 40 may be different from a refractive index of the nanostructure forming layer 30 and may be also different from a refractive index of the support layer SU. The refractive index of the upper dielectric layer 24 may be different from the refractive index of the nanostructure forming layer 30.

Figure 25:
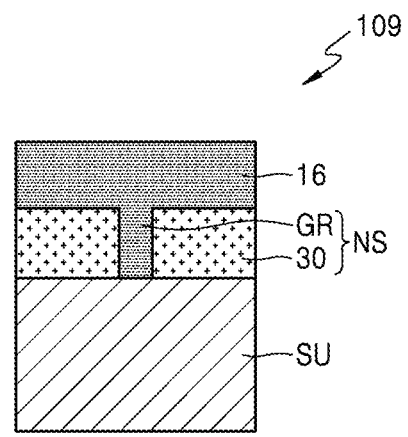

Referring to FIG. 25, a meta optical device 109 may include a support layer SU, a nanostructure NS, and a cover layer 16. The nanostructure NS may include a nanostructure forming layer 30 arranged above the support layer SU and having a refractive index greater than that of the support layer SU, and a groove region GR arranged in the nanostructure forming layer 30. The cover layer 16 may fill the groove region GR and extend upward from the nanostructure forming layer 30. The refractive index of the cover layer 16 may be different from the refractive index of the nanostructure forming layer 30. The refractive index of the cover layer 16 may be substantially equal to the refractive index of the support layer SU.

Figure 26:
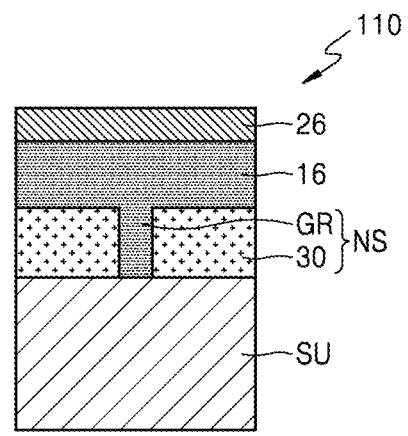

Referring to FIG. 26, a meta optical device 110 may include a support layer SU, a nanostructure NS, a cover layer 16, and an upper dielectric layer 26. The nanostructure NS may include a nanostructure forming layer 30 arranged above the support layer SU and having a refractive index greater than that of the support layer SU, and a groove region GR formed by recessing the nanostructure forming layer 30. The cover layer 16 may fill the groove region GR and extends upward from the nanostructure forming layer 30. The upper dielectric layer 26 may be arranged above the cover layer 16.

The refractive index of the cover layer 16 may be different from the refractive index of the nanostructure forming layer 30. The refractive index of the upper dielectric layer 26 may be different from the refractive index of the cover layer 16. The refractive index of the cover layer 16 may be substantially equal to the refractive index of the support layer SU.

The combination of the cover layer surrounding the nanostructure, and the upper dielectric layer and the lower dielectric layer arranged above and under the nanostructure, which are applied to the unit configurations described with reference to FIGS. 15, 17, and 19-26, is not limited to the above examples, and other combinations may be applied thereto.

Figure 27:
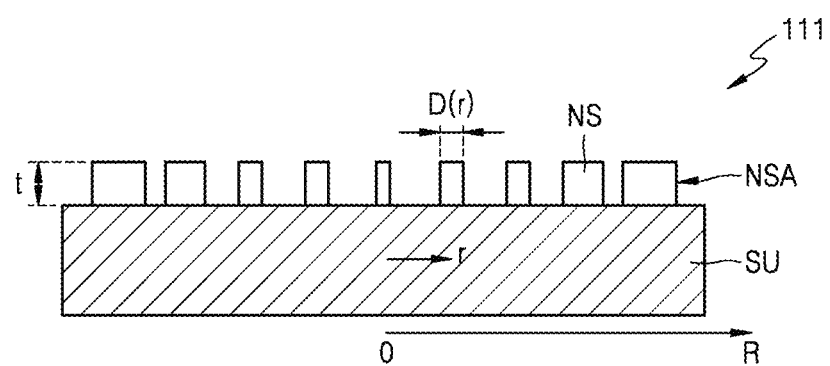
FIGS. 27 and 28 are cross-sectional views illustrating nanostructure arrays of meta optical devices according to various exemplary embodiments.
Figure 28:
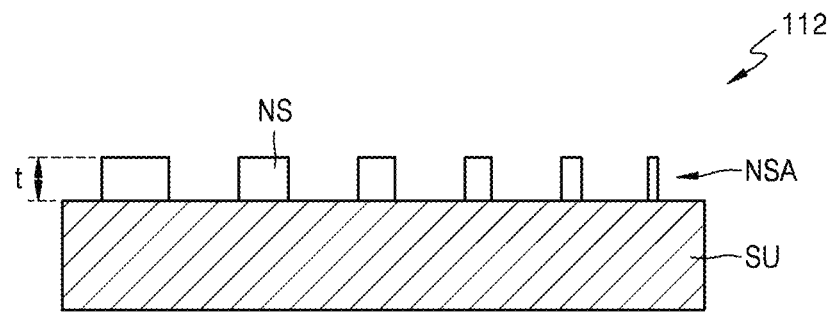

FIGS. 27 and 28 are cross-sectional views illustrating nanostructure arrays of meta optical devices according to various exemplary embodiments.

Referring to FIG. 27, a meta optical device 111 may include a support layer SU and a nanostructure array NSA. The nanostructure array NSA may include a plurality of nanostructures NS arranged above the support layer SU. The nanostructures NS may be arranged to form a dimension distribution that changes a phase of incident light with a certain regularity according to a position. In the present exemplary embodiment, the dimensions and arrangement of the meta optical device 111 are determined so that the meta optical device 111 may function as a concave lens, that is, have negative refractive power to diverge incident light. When a position r of the nanostructure NS is defined by a distance from the center of the meta optical device 111 in a radial direction, a diameter of D(r) of the nanostructure NS disposed at the position r may be determined to have a specific value so that the meta optical device 111 may operate as a concave lens. The value of D(r) may increase as the position r increases from the center in the radial direction, and this regularity may be repeated in the radial direction. The repeated periods (e.g., repeated intervals) may not be consistent and may be changed.

Referring to FIG. 28, a meta optical device 112 may include a support layer SU and a nanostructure array NSA. The nanostructure array NSA may include a plurality of nanostructures NS arranged above the support layer SU. The nanostructures NS may be arranged to form a dimension distribution that changes a phase of incident light with a certain regularity according to a position. In the present exemplary embodiment, the dimensions and arrangement of the meta optical device 112 may be determined so that the meta optical device 112 may function as an optical deflector.

The meta optical devices 111 and 112 of FIGS. 27 and 28 are illustrated as having the same unit configuration as the meta optical device 100 of FIG. 1, but exemplary embodiments are not limited thereto. For example, the unit configurations described with reference to FIGS. 15, 17, and 19-26 may be used.

The meta optical devices 100, 111, and 112 have been described above as functioning as a convex lens, a concave lens, and an optical deflector, and the shape, arrangement, and size of the nanostructure may be determined to perform various other functions. For example, the meta optical device may function as an optical distributor that refracts light in a plurality of directions, or may function as a convex mirror or a concave mirror having a flat plate shape.

Alternatively, since it is possible to implement a plurality of meta optical devices having different refractive powers while having the same flat plate shape, various optical systems, for example, a microscope optical system or a telescope optical system, may be miniaturized by using the plurality of meta optical devices.

Figure 29:
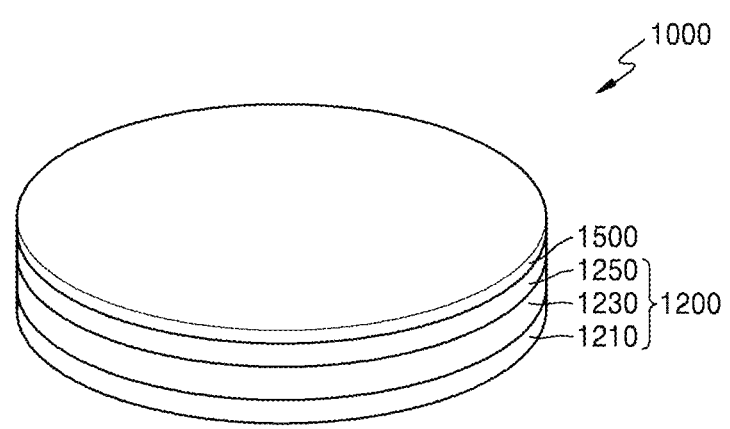
FIG. 29 is a perspective view illustrating a schematic configuration of an optical apparatus including a meta optical device, according to an exemplary embodiment.

FIG. 29 is a perspective view illustrating a schematic configuration of an optical apparatus 1000 including a meta optical device, according to an exemplary embodiment.

The optical apparatus 1000 may include a light-emitting device 1200 and a meta optical device 1500 arranged above the light-emitting device 1200. The light-emitting device 1200 may be a vertical-external-cavity surface-emitting laser (VECSEL) including a gain layer 1230 and reflective layers 1210 and 1250 arranged on both sides of the gain layer 1230. The reflective layers 1210 and 1250 may be a distributed Bragg reflector (DBR).

The meta optical device 1500 may be arranged above a light emission surface of the light-emitting device 1200 and focus, diverge, shape, or deflect light generated and emitted from the light-emitting device 1200. The meta optical device 1500 may use the above-described meta optical devices 100 to 112, and the shape, size, arrangement, and position of the nanostructure NS may be determined according to an optical function to be implemented.

FIGS. 30A to 30D are plan views illustrating various examples of nanostructure arrays of meta optical devices applicable to the optical apparatus of FIG. 29.

Figure 30A:
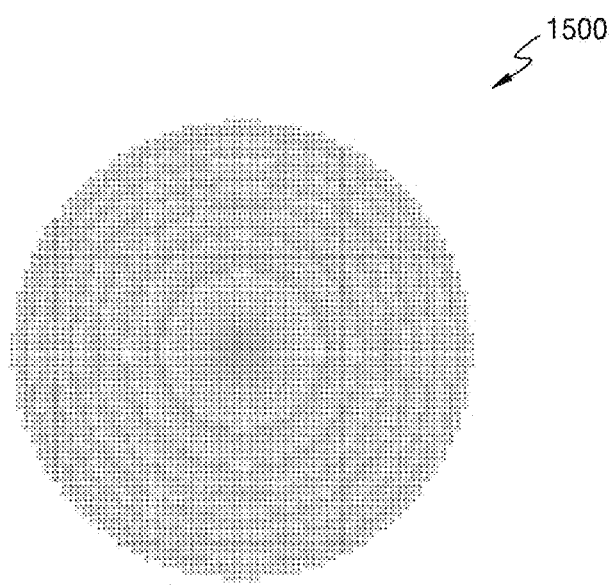
FIGS. 30A to 30D are plan views illustrating various examples of nanostructure arrays of meta optical devices applicable to the optical apparatus of FIG. 29.
Figure 30B:
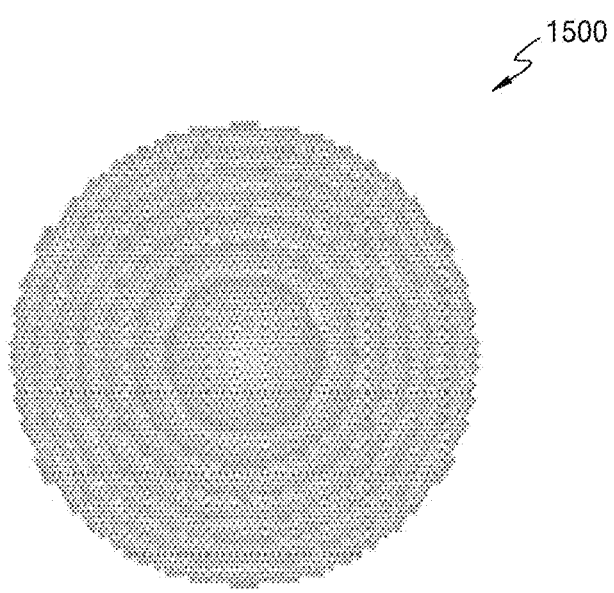

FIG. 30A illustrates a nanostructure array configured to perform a convex lens function, and FIG. 30B illustrates a nanostructure array configured to perform a concave lens function.

Figure 30C:
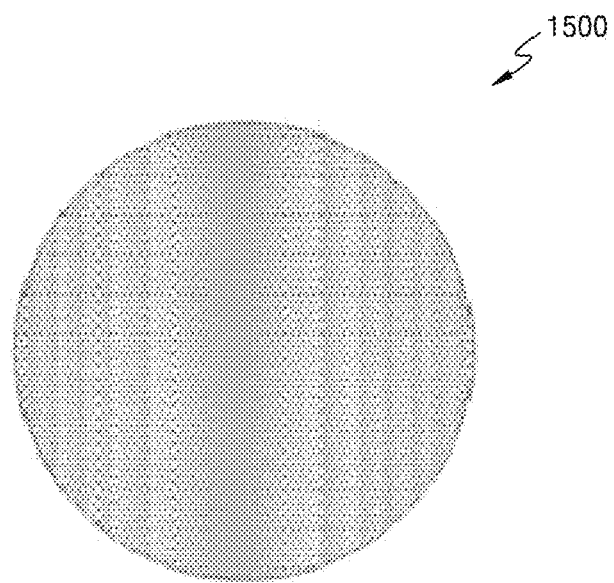
Figure 30D:
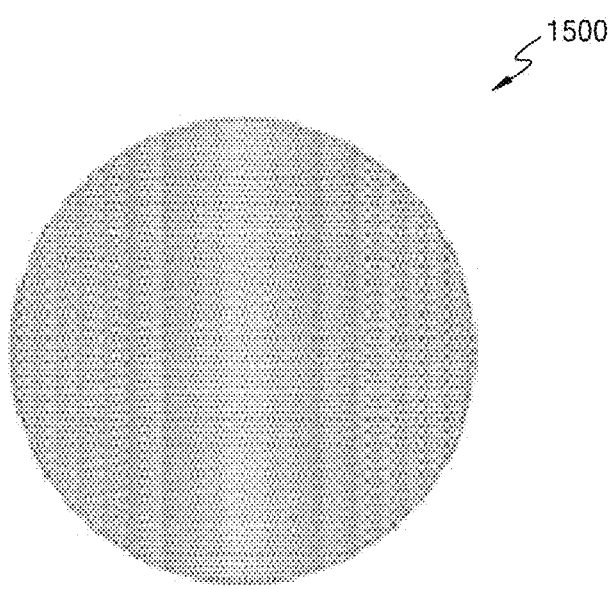

FIGS. 30C and 30D respectively illustrate nanostructure arrays to which regular patterns are applied in the horizontal direction for focusing and diverging light, respectively, and in which a beam is linearly shaped and emitted.

The case where the meta optical device 1500 is applied to the light-emitting device 1200 has been described, but the meta optical device 1500 may be applied to various optical devices, for example, a polarizer, a polarization cleanup module, an optical filter, a sensor, and a display device.

According to the method of designing the meta optical device described above, the shape dimension showing the phase defect may be substituted with a normal value.

Therefore, the meta optical device designed by the above-described method has a structure in which the dimension showing the phase defect is removed, thereby exhibiting excellent optical performance.

Furthermore, since the above-described meta optical device can be implemented to have a flat plate shape, it is advantageously applicable to various optical devices. For example, since the refractive power can be implemented in a flat plate shape and the refractive power is adjusted by the arrangement or size of the nanostructure, a volume of the meta optical device is not increased due to an increase in refractive power.

The various exemplary embodiments disclosed herein may be implemented by a computer. For example, the computer may be a special-purpose computer specifically meant for designing optical devices. The computer may include computer-readable storage medium, such as a read-only memory (ROM), a random access memory (RAM), a hard drive, a solid-state drive (SSD), a flash memory, etc. storing instructions (e.g., code) executed by the processor to perform various operations as described herein.

It should be understood that exemplary embodiments described herein should be considered in a descriptive sense only and not for purposes of limitation. Descriptions of features or aspects within each embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope as defined by the following claims.

What is claimed is:

1. A method of designing a meta optical device, the method comprising:

setting, via a processor, design data for arrangement and shape dimensions of a nanostructure of the meta optical device, according to a function to be implemented by the meta optical device;

obtaining a phase change graph with respect to a change in the shape dimensions;

setting a shape dimension region with phase defect in the phase change graph; and substituting a shape dimension with phase defect, which is included in the shape dimension region with phase defect among the dimensions included in the design data, with a substitution value that is outside the shape dimension region with phase defect.

2. The method of claim 1, wherein the shape dimension region with phase defect corresponds to a region where a sign of a slope in the phase change graph reverses.

3. The method of claim 2, wherein a range of a dimension included in the shape dimension region with phase defect is defined by an inequality, DMIN_PD<DR_PD<DMAX_PD, a left region of the shape dimension region with phase defect in the phase change graph is a first normal region, and a right region thereof is a second normal region, wherein "DMIN_PD" is a numeral indicating lower limit of the shape dimension region with phase defect, and "DMAX_PD" is a numeral indicating an upper limit of the shape dimension region with phase defect, and wherein DMIN_PD and DMAX_PD are determined such that a first sign of a first slope of a straight line connecting two points of the phase change graph respectively corresponding to DMIN_PD and DMAX_PD, a second sign of a first average slope of the phase change graph in the first normal region, and a third sign of a second average slope of the phase change graph in the second normal region are equal to one another.

4. The method of claim 2, wherein a range of a dimension included in the shape dimension region with phase defect is defined by an inequality, DMIN_PD<DR_PD<DMAX_PD, a left region of the shape dimension region with phase defect in the phase change graph is a first normal region, and a right region thereof is a second normal region, wherein "DMIN_PD" is a numeral indicating a lower limit of the shape dimension region with phase defect, and "DMAX_PD" is a numeral indicating an upper limit of the shape dimension region with phase defect, and wherein DMIN_PD and DMAX_PD are determined such that a first slope of a straight line connecting two points of the phase change graph respectively corresponding to DMIN_PD and DMAX_PD has a value between a second slope of the phase change graph at DMIN_PD and a third slope of the phase change graph at DMAX_PD.

5. The method of claim 2, wherein a range of a dimension included in the shape dimension region with phase defect is defined by an inequality, DMIN_PD<DR_PD<DMAX_PD, a left region of the shape dimension region with phase defect in the phase change graph is a first normal region, and a right region thereof is a second normal region, wherein "DMIN_PD" is a numeral indicating a lower limit of the shape dimension region with phase defect, and "DMAX_PD" is a numeral indicating an upper limit of the shape dimension region with phase defect, and wherein DMIN_PD and DMAX_PD are determined such that a first slope of a straight line connecting two points of the phase change graph respectively corresponding to DMIN_PD and DMAX_PD has a value between a first average slope of the phase change graph in the first normal region and a second average slope of the phase change graph in the second normal region.

6. The method of claim 3, wherein the substitution value is one of DMIN_PD and DMAX_PD.

7. The method of claim 3, wherein, a plurality of shape dimension with phase defects are substituted with one selected from DMIN_PD and DMAX_PD.

8. The method of claim 3, wherein at least one substitution value that is substituting for a plurality of shape dimensions with phase defect is adjusted to DMIN_PD when the at least one shape dimension with phase defect is closer to DMIN_PD than to DMAX_PD, and the at least one substitution value is adjusted to DMAX_PD when the at least one shape dimension with phase defect is closer to DMAX_PD than to DMIN_PD.

9. A meta optical device designed by the method of claim 1.

10. A meta optical device comprising:
a support layer; and
a plurality of nanostructures provided above the support layer, the plurality of nanostructures being arranged to form a dimension distribution that changes a phase of incident light with a certain regularity based on positions of the plurality of nanostructures, and having dimension values that are less than a wavelength of the incident light,
wherein signs of slopes of a phase change graph showing a phase change of the incident light with respect to the dimension values of the plurality of nanostructures are consistent.

11. The meta optical device of claim 10, wherein the dimension values of the plurality of nanostructures exclude a value included in a shape dimension region with phase defect extracted from the phase change graph of the incident light with respect to the dimension values.

12. The meta optical device of claim 10, wherein the dimension values of the plurality of nanostructures exclude a value causing resonance or quasi-resonance with respect to the incident light.

13. The meta optical device of claim 10, wherein the plurality of nanostructures have at least one of a cylindrical shape and a polygonal column shape, and
wherein the dimension values comprise at least one of a diameter of a cross-sectional circle of a cylinder and a length of one side of a cross-sectional polygon of a polygonal column.

14. The meta optical device of claim 10, wherein a protrusion height (t) of the plurality of the nanostructures protruding from the support layer satisfies a condition, $\lambda/(2n_{swg}) < t < \lambda$, and
wherein $\lambda$ is the wavelength of the incident light, and $n_{swg}$ is a refractive index of the plurality of nanostructures.

15. The meta optical device of claim 10, wherein the phase change of the incident light due to the plurality of nanostructures covers a range of 0 degrees to 360 degrees.

16. The meta optical device of claim 10, wherein the plurality of nanostructures include one of a dielectric material and a semiconductor material.

17. The meta optical device of claim 10, wherein a refractive index of the plurality of nanostructures is greater than a refractive index of the support layer.

18. The meta optical device of claim 10, further comprising a cover layer covering a surface of each of the plurality of nano structures in a form of a shell and having a refractive index that is different from a refractive index of the plurality of nanostructures.

19. The meta optical device of claim 10, further comprising a cover layer entirely covering the plurality of nanostructures.

20. The meta optical device of claim 18, wherein the refractive index of the cover layer is substantially equal to a refractive index of the support layer.

21. The meta optical device of claim 18, further comprising an upper dielectric layer arranged above the cover layer and having a refractive index that is different from the refractive index of the cover layer.

22. The meta optical device of claim 10, further comprising a lower dielectric layer arranged between the support layer and the plurality of nanostructures.

23. The meta optical device of claim 10, wherein the plurality of nanostructures comprise a nanostructure forming layer through which a groove is formed and which is arranged above the support layer, and including a material having a refractive index that is greater than a refractive index of the support layer.

24. The meta optical device of claim 23, further comprising a lower dielectric layer arranged between the support layer and the nanostructure forming layer.

25. The meta optical device of claim 24, further comprising an upper dielectric layer arranged above a cover layer and having a refractive index that is different from a refractive index of the cover layer.

26. The meta optical device of claim 23, further comprising a cover layer filling the groove of the nanostructure forming layer and extending upward from the nanostructure forming layer.

27. The meta optical device of claim 26, further comprising an upper dielectric layer arranged above the cover layer and having a refractive index that is different from a refractive index of the cover layer.

28. An optical apparatus comprising the meta optical device of claim 10.

29. The meta optical device of claim 10, further comprising a cover layer having a thickness substantially equal to a height of the plurality of nanostructures in a region between the plurality of nanostructures above the support layer, and having a refractive index that is different from the refractive index of the nanostructures.

30. An meta optical device comprising:
a support layer with a first refractive index, wherein the support layer is shaped as a disc with a center and a rim;
a plurality of nanostructures with a second refractive index greater than the first refractive index, the plurality of nanostructures protruding at a uniform height from a surface of the support layer, each nanostructure of the plurality of nanostructures having at least one dimension that is less than an operating wavelength of the meta optical device, wherein the plurality of nanostructures are arranged on the surface of the support layer such that a width of the cross-section of the each nanostructure in the plurality of nanostructures is determined based on a distance of the each nanostructure from the center of the disc, and wherein a phase change caused by the each nanostructure on incident light passing through the each nanostructure is based on the diameter of the each nanostructure,
wherein widths of the cross-sections of the plurality of nanostructures are selected such that a phase change distribution of the plurality of nanostructures from the center of the disc to the rim of the disc is monotonic.

* * * * *